United States Patent [19]
Pfeifer et al.

[11] 4,342,910
[45] Aug. 3, 1982

[54] OPTOELECTRONIC ABSOLUTE POSITION ENCODER WITH AN IN-LINE GRAY CODE CONTROLLING VEHICLE ACCELERATION

[75] Inventors: George F. Pfeifer; George R. Koonce, both of Liverpool; Jack E. Phillips, Fayetteville, all of N.Y.

[73] Assignee: General Electric Company, Schenectady, N.Y.

[21] Appl. No.: 184,213

[22] Filed: Sep. 5, 1980

[51] Int. Cl.³ ............................................. H01J 3/14
[52] U.S. Cl. ............................ 250/237 G; 340/347 P
[58] Field of Search ................. 364/852; 250/231 SE, 250/237 G, 211 K, 229; 356/395, 396; 323/902, 906; 340/347 P

[56] References Cited

U.S. PATENT DOCUMENTS 3,484,780 12/1969 Kamoi et al. ...................... 340/347 P
4,092,571 5/1978 Hopkins et al. ...................... 318/106
4,135,086 1/1979 Baba ................................ 250/237 G
4,180,704 12/1979 Pettit .................................. 356/395

Primary Examiner—David C. Nelms
Attorney, Agent, or Firm—Alexander M. Gerasimow; James C. Davis, Jr.; Marvin Snyder

[57] ABSTRACT

An optoelectronic encoder senses the absolute position of an accelerator pedal or lever in a battery powered vehicle and provides a linear or nonlinear control voltage in response thereto. The Gray code is fabricated on an encoder slide in an in-line arrangement which minimizes decoding errors due to stray light and skew within the encoder. In the preferred embodiment, the Gray coded output from the encoder is converted to binary, which is then converted into analog form and applied to a linear or nonlinear function generator circuit. The nonlinear function generator circuit comprises parallel-coupled amplifier stages, the outputs of which are selectively clamped depending on the amplitude of the input signal from digital-to-analog converter.

12 Claims, 6 Drawing Figures

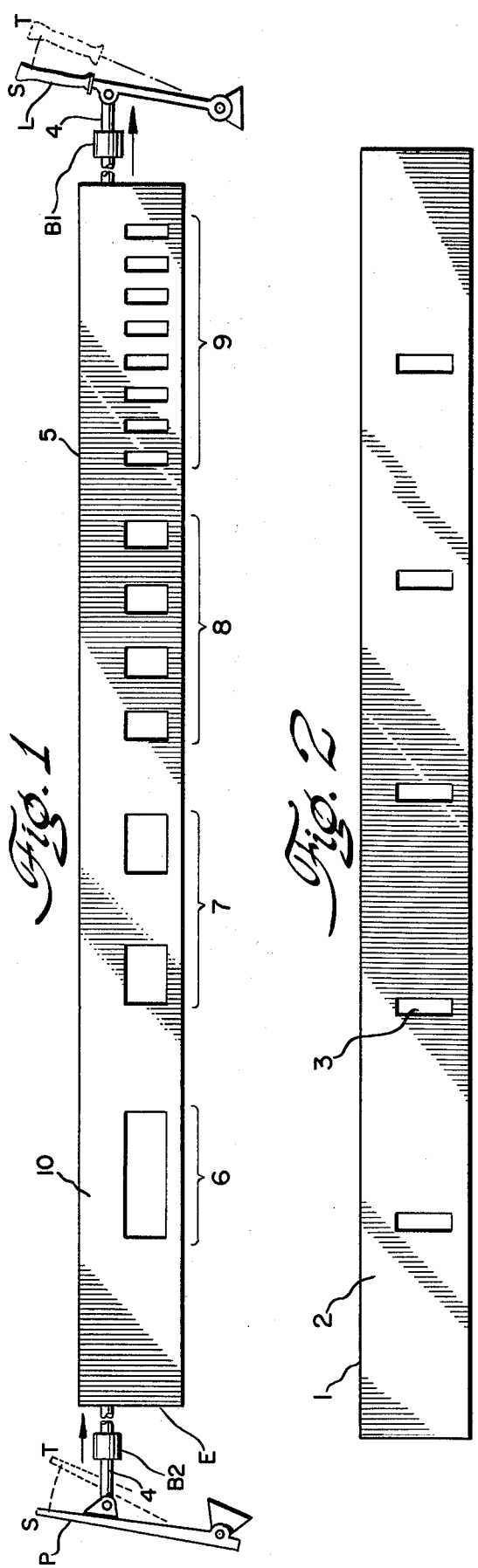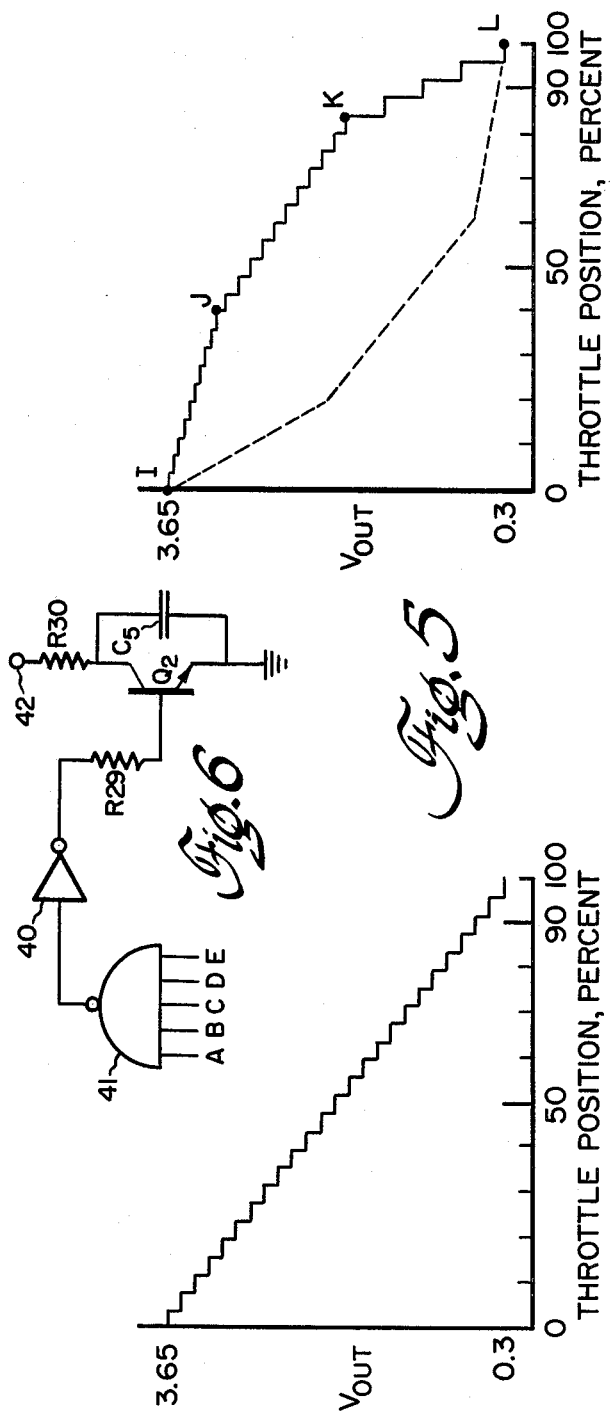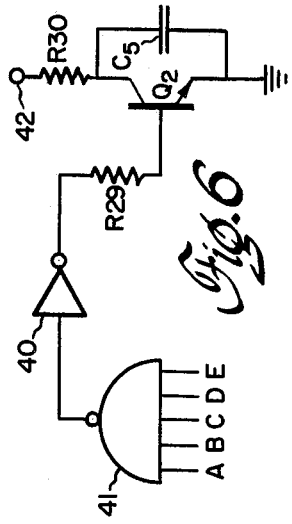

OPTOELECTRONIC ABSOLUTE POSITION ENCODER WITH AN IN-LINE GRAY CODE CONTROLLING VEHICLE ACCELERATION

BACKGROUND OF THE INVENTION

This invention relates to accelerator position encoders. More specifically, this invention relates to an optoelectronic absolute position encoder capable of providing linear or non-linear control voltage representative of the accelerator position.

Accelerator position encoders are employed in battery powered vehicles such as fork lift trucks, mining vehicles, and on-road vehicles to provide an interface between the accelerator pedal or lever and traction drive control circuitry. In response to the accelerator position indicating signal from the encoder, the traction drive control circuit regulates the energy supplied by an inverter or converter to the vehicle's traction motor. Typically, mechanical linkage elements are provided to transmit the motion of the accelerator to the encoder which provides an electrical signal corresponding to the position of the accelerator. Frequently, the mechanical linkage also operates a cam-activated safety switch or contactor connected in series with the electric vehicle's battery. The switch is designed to be open when the accelerator is at rest so that chances of accidental start-up of the traction motor are minimized.

Generally, a "full-on" detect circuit is also included in combination with the position encoder. The circuit is designed to detect a predetermined output signal from the position encoder, indicating that the accelerator is in a preselected position. Typically, it is desirable to detect when the accelerator has traveled more than 90 percent of its maximum range. The "full-on" signal from the detect circuit and a separate indication of demand for maximum power output from the traction motor activate a contactor which bypasses power-consuming traction drive control circuitry and applies full battery potential to the traction motor. Demand for maximum power in a fork-lift truck, for example, occurs when a load, too heavy to lift, is pushed along the floor surface.

Among the devices employed in conventional encoders are nonlinear potentiometers, optically transparent disks (the optical transmissivity of which varies along the circumference), and linear voltage differential transformers (LVDT).

In encoders utilizing a nonlinear potentiometer, output voltage is dependent on the position of the potentiometer shaft which is usually coupled to rotate in response to accelerator motion. The useful working life of a potentiometer is, however, relatively short due to the high number of mechanical moving parts. Potentiometers are also sensitive to mechanical vibration and shock. Operation of an encoder utilizing an optical encoder disk is similar to that employing a potentiometer in that the degree of disk rotation from a start point is dependent on accelerator position. The encoder's output voltage is determined by the optical transmissivity of the disk portion between a light source and a photodetector.

In encoders employing a LVDT, the accelerator is coupled to a movable core disposed through two identical transformer secondary windings. Actuation of the accelerator displaces the core so that a greater portion of it is within one of the windings. This results in unequal flux concentration through the windings and concomitantly different output voltages from each. The precise difference, indicative of accelerator position, is obtained by rectification and subtraction of the respective winding voltages.

The present invention provides an optoelectronic encoder for sensing the absolute position of an accelerator or lever in a battery powered vehicle and which provides a digital linear or analog nonlinear and analog linear output signals in response thereto. The optoelectronic position encoder is a low-cost, long-life, and reliable device compared to the devices of the prior art. Test encoders in accordance with the present invention have performed satisfactorily through more than $8 \times 10^6$ operations. The encoder is also capable of operating in ambient temperatures ranging between $-30°$ C. and $60°$ C. and to withstand 300 pounds of continuous force and up to 1000 pounds of impulsive force on the encoder actuator.

The optoelectronic encoder employs a Gray code slide and optoelectronic interrupters for non-contact position sensing. The Gray code pattern (a binary notation in which sequential numbers are represented by binary expressions, each of which differs from the preceding expression in one place only) is fabricated on a slide in an in-line fashion, so that optically transparent windows representing the bits of Gray code are in tandem, rather than side by side. This arrangement minimizes encoding errors associated with the side-by-side Gray code slide in which the transparent windows are parallel to each other, and in which slight skewing or mechanical tilting of the slide with respect to optoelectronic interrupters produces errors in the position indicating Gray coded signals because the edges of the slide windows do not line up.

The optoelectronic encoder of this invention also provides superior immunity to system electrical noise, electromagnetic interference, mechanical vibration, and shock. Since the accelerator position is encoded by the Gray code pattern on the slide, readings disrupted by electrical or mechanical interference are easily re-encoded and operation returned to normal. Filtering circuits and CMOS integrated circuit devices further help improve encoder immunity to the above-identified sources of noise. Additionally, the encoder requires only a simple optical alignment of an encoder mask since in the preferred embodiment, electrical adjustments to obtain a desired encoder output voltage function are made during the fabrication of encoder circuitry.

These and other features provided by the present invention will be more fully described in the detailed description of the invention.

SUMMARY OF THE INVENTION

The optoelectronic encoder of the present invention employs an encoder slide positioned between the light-emitting diodes (LEDs) and photodetectors of an optical-interrupter assembly. The slide includes optically transparent windows arranged in tandem in a Gray code pattern. The slide is movably mounted and is mechanically linked to, for example, the accelerator pedal or lever on an electric vehicle. Accelerator motion is transmitted to the slide, so that for a given accelerator position, certain ones of the windows allow radiation from the LEDs to strike certain ones of the photodetectors which provide a Gray coded output representing the absolute position of the slide and concomitantly the accelerator. Circuitry is provided to convert the gray coded signal to binary. Although the binary signal may be applied directly to a digital traction drive controller, in the preferred embodiment the binary output is converted to analog in a digital-to-analog (D/A) converter and applied to a function generator circuit. The function generator circuit comprises parallel-coupled amplifiers, the outputs of which are selectively clamped, depending on the amplitude of the input signal from the D/A converter, to generate the linear or nonlinear output voltage function. The encoder also includes logic circuitry to produce a "full-on" signal upon detecting a predetermined binary output from the D/A converter.

Accordingly, it is an object of the invention to provide a low-cost, optoelectronic absolute position encoded accelerator control providing long-life, reliable operation and which is operable over a wide range of operating conditions.

Another object of the invention is to provide an optoelectronic absolute position encoder accelerator control, including an encoder slide having an in-line Gray code pattern fabricated thereon.

Still another object of the invention is to provide an optoelectronic absolute position encoded accelerator control including a function generated circuit comprising parallel coupled amplifier stages, the outputs of which are selectively clamped to provide a nonlinear output control voltage.

BRIEF DESCRIPTION OF THE DRAWINGS

FIG. 1 illustrates the encoder slide in accordance with the invention.

FIG. 2 illustrates the mask employed in the optoelectronic encoder.

FIG. 4 is a graphical depiction of the linear output voltage function produced by the optoelectronic position encoder of the invention.

FIG. 5 is a graphical depiction of the nonlinear output voltage function produced by the optoelectronic position encoder of the invention.

FIG. 6 is a schematic diagram of the "full-on" decode circuit employed in the apparatus of the invention.

DETAILED DESCRIPTION OF THE INVENTION

Figure 3:
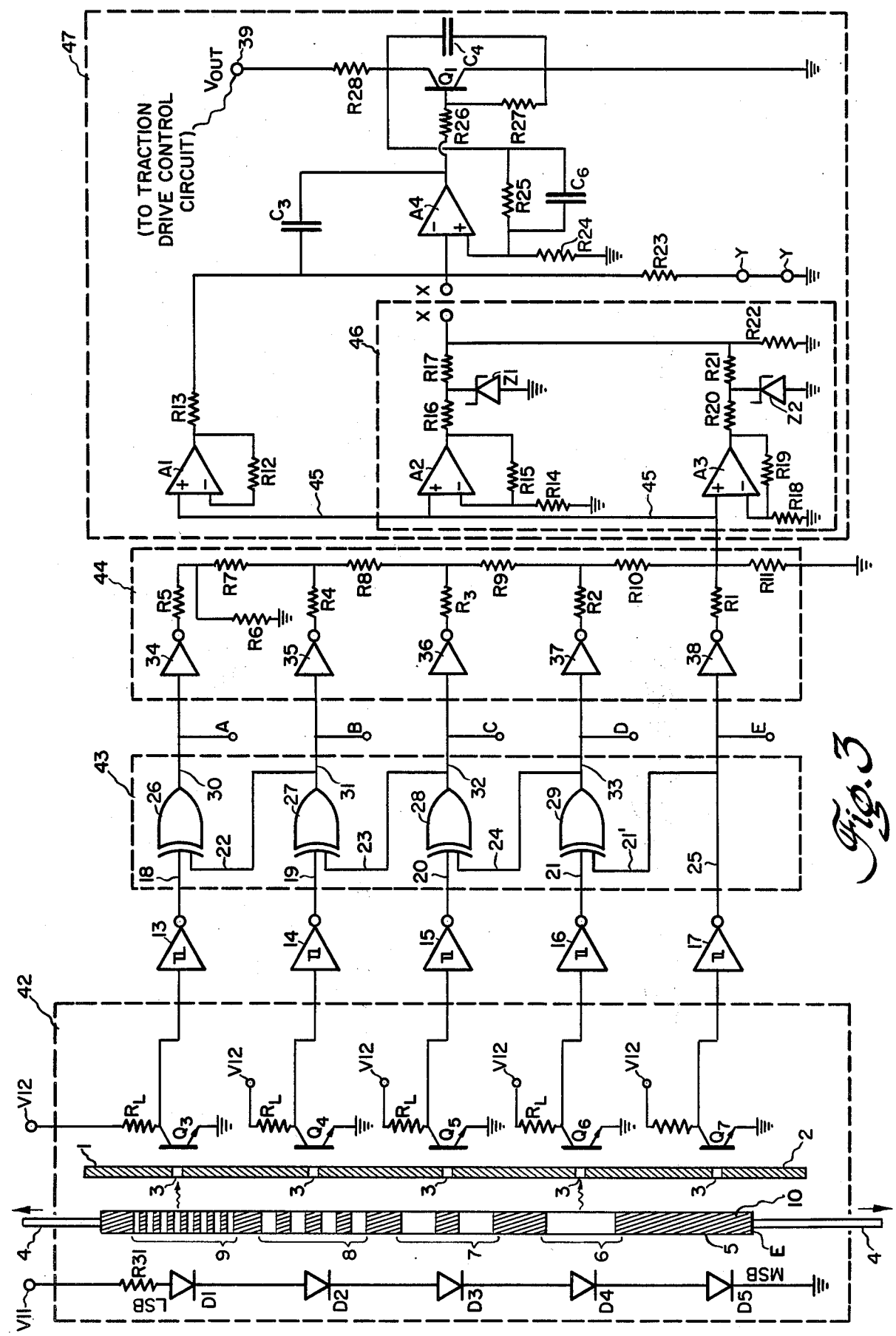
FIG. 3 is a schematic diagram of the optoelectronic absolute position accelerator encoder in accordance with the present invention.

FIG. 1 illustrates an encoder slide 5 employed in the optoelectronic encoder of the present invention schematically illustrated in FIG. 3. The slide is coupled on one side through a bushing B2 to an accelerator pedal P by means of a partially shown mechanical linkage 4 and on its other side to a lever L through a bushing B1 and a similar linkage 4. A solid line S represents the "at rest" positions of pedal P and lever L, while a dashed line T represents the maximum or full throttle position. Bushings B1 and B2 mount slide 5 in an accelerator assembly housing (not shown) and together with mechanical linkage 4 are the sole points in the encoder subject to mechanical wear, which fact contributes to its durability.

Although encoder slide 5 is shown as operable by means of lever L and accelerator pedal P, it is to be understood that in any given embodiment only one is typically employed.

Encoder slide 5 includes optically transparent Gray code windows 6-9 fabricated in tandem, colinearly with the direction of slide movement as indicated by oppositely pointed, horizontal arrows alongside mechanical linkage 4. Transparent windows 9 encode the least significant bit (LSB) of the Gray code, while opaque area 10 in cooperation with the portion of slide 5 beyond edge E encodes the most significant bit (MSB). In one embodiment, encoder slide 5 travels a distance of one-half inch (14 mm) in response to actuation of throttle pedal P or lever L from position S to position T. This provides an output voltage which is amplitude-variable in thirty-two steps from maximum to minimum.

FIG. 2 illustrates mask 1 having 10 mil wide slots 3 fabricated on an opaque strip 2. Slots 3 are made sufficiently narrow and mask 1 is fixedly mounted at a suitable distance from photodetectors Q3-Q7, shown in FIG. 3, to prevent stray light from adjacent light-emitting diodes D1-D5 from unintentionally striking any of the photodetectors Q3-Q7.

Encoder slide 5 and mask 1 may be stamped or etched from nonreflective metal strips. Such fabrication methods and materials are considerably less expensive than sputtering chromium on glass, as is done in the manufacture of some encoder slides. Alternatively, encoder slide 5 and mask 1 may be fabricated as thick film opaque material on glass or transparent film laminated in plastic. Bushings B1 and B2 may be of the type known as "graphitar bushings."

The preferred embodiment of the linear and nonlinear encoder are schematically illustrated in FIG. 3. The embodiment of the linear encoder will be discussed first, and accordingly an open circuit is shown between points X-X and a conductive shunt is shown coupling points Y—Y. Such connection of points X—X and Y—Y electrically disconnects a nonlinear gain circuit 46 of a function generator circuit 47.

The optoelectronic encoder illustrated in FIG. 3 consists essentially of four main circuit portions 42-44 and 47. Encoder assembly 42 provides a five bit Gray coded output which is applied through Schmitt trigger circuits 13-17 to a Gray code to binary converter 43 which supplies a binary coded signal to output terminals A-E. The binary signal may be utilized directly to drive a digital traction drive controller (not shown). However, in the preferred embodiment, the binary signals from converter 43 are applied to a D/A converter 44 and the analog output thereof is coupled to a function generator circuit 47. A linear output voltage $V_{out}$ appears at an output terminal 39 of the function generator circuit.

An exemplary linear output voltage $V_{out}$ appearing at output terminal 39 of function generator circuit 47 is depicted graphically in FIG. 4 as a negatively sloped, linearly decreasing function of throttle position. At the 0 percent throttle position point of FIG. 4, which corresponds to rest position S in FIG. 2, the output voltage is approximately 3.65 volts. Progressive movement of the accelerator from point S to maximum travel point T, 100 percent on the horizontal throttle position axis, causes voltage $V_{out}$ to decrease in step-wise manner to 0.3 volts, which is the minimum voltage drop across output transistor Q1. For clarity of description, FIG. 5 shows the decrease of voltage $V_{out}$ from maximum to minimum value in fewer than thirty-two steps; however, the embodiment illustrated in FIG. 3 provides a thirty-two step voltage resolution. Each step change in voltage corresponds to the increment or decrement of one Gray code bit in response to the movement of encoder slide 5.

The detailed circuitry of encoder 42 includes light-emitting diodes D1–D5 coupled in series-aiding fashion. Diodes D1–D5 are energized from a voltage source V11 through current-limiting resistor R31, connected to the anode of diode D1. The cathode of the diode D5 is connected to ground. Phototransistors Q3–Q7 are each energized from a voltage source V12 through a load resistance $R_L$ in the collector circuit thereof, respectively. The emitter of each of transistor Q3–Q7 is connected to ground. Diodes D1–D5 and phototransistors Q3–Q7 comprise an optical interrupter assembly through which slide 5 is positioned to move. Conveniently, the optical interrupter may be made up of five integral optoelectronic interrupter devices, each comprising a light emitting diode optically aligned with a phototransistor (commercially available from the Semiconductor Products Department of the General Electric Company). For example, diode D1 and phototransistor Q3 comprise one such optoelectronic interrupter. In the preferred embodiment, five such devices comprising diode and phototransistor pairs D1–Q3, D2–Q4, D3–Q5, D4–Q6, and D5–Q7 are mounted side by side to produce a complete optical interrupter assembly.

Encoder 42 also includes mask 1 fixedly mounted adjacent to phototransistors Q3–Q7. Mask slots 3 are positioned in optical alignment with diodes D1–D5 and phototransistors Q3–Q7. An encoder slide 5 is movably mounted between mask 1 and diodes D1–D5. In response to linear accelerator motion transmitted to slide 5 by means of mechanical linkage 4, slide 5 moves linearly across the optical paths between diodes D1–D5 and phototransistors Q3–Q7. The slide's line of travel is indicated by oppositely pointed arrows shown alongside mechanical linkage 4. As the slide moves, windows 6–9, opaque area 10, and edge E selectively intercept the optical path between diodes D1–D5 and phototransistors Q3–Q7, so that a bit (0 or 1) appears on the collector of each of phototransistors Q3–Q7. Collectively, the output voltages on the collectors of phototransistors Q3–Q7 represent a five bit Gray coded signal indicative of the position of the slide and concomittanly the position of the accelerator.

The five bit Gray coded signal is supplied from phototransistors Q3–Q7 to Schmitt trigger circuits 13–17, respectively. The function of trigger circuits 13–16 is to transmit to exclusive OR gates 26–29, respectively, of Gray code to binary converter 43, only actual bit levels (0 or 1) and filter any noise impulses which could result in erratic outputs from OR gates 26–29. The output of trigger circuit 17 is coupled to the input of inverter 38 of a D/A converter 44 and to an input 21' of exclusive OR gate 29.

The outputs from Schmitt trigger circuits 13–16 drive inputs 18–21 of exclusive OR gates 26–29, respectively. Inputs 22–24 of OR gates 26–28 are coupled to outputs 31–33, respectively, of OR gates 27–29. No exclusive OR gate connection is provided between Schmitt trigger circuit 17 and inverter 38 because the most significant bit of Gray code is logically equivalent to the corresponding binary bit making conversion unnecessary.

The purpose of exclusive OR gates 26–29 is to convert to binary the Gray coded signals produced by phototransistors Q3–Q7. For example, when slide 5 is in the exemplary position illustrated in FIG. 3, only phototransistors Q6 and Q3 are unobstructed by opaque area 10 of slide 5, so that optical wavelength radiation from diodes D4 and D1 impinges thereon, respectively, through window 6 and one of windows 9, respectively.

In response thereto, each of phototransistors Q6 and Q3 produces an output (1), while the remaining phototransistors Q4, Q5, and Q7 do not produce an output (0). Therefore, the Gray coded output signal from phototransistors Q3–Q7, beginning with phototransistor Q7 which produces the most significant bit signal, comprises a five bit code 01001. The table below summarizes the input signals on inputs 18–24 and 21' of exclusive OR gates 26–29, resulting from the application thereto, respectively, of Gray code signal 01001. Since an exclusive OR gate produces an output if one and only one input is present, the binary output on terminals E–A, respectively, corresponding to the inputs to gates 26–29 is 01110.

TABLE

| Phototransistor | Gray Code | Exclusive OR Gate | Gate Input Signal | Terminal | Binary Code |
|---|---|---|---|---|---|
| Q7 (MSB) | 0 | None | None | E | 0 |
| Q6 | 1 | 29 | 21 = 1<br>21' = 0 | D | 1 |
| Q5 | 0 | 28 | 20 = 0<br>24 = 1 | C | 1 |
| Q4 | 0 | 27 | 19 = 0<br>23 = 1 | B | 1 |
| Q3 (LSB) | 1 | 26 | 18 = 1<br>22 = 1 | A | 0 |

The binary output from converter 43 appears at points A–E and is applied to inverters 34–38 of D/A converter 44. Inverters 34–38 provide drive to a resistor ladder comprising resistors R1–R11. Resistors R6–R11 are coupled in series. The free ends of resistors R6 and R11 are connected to ground. The outputs of inverters 34–38 are respectively coupled through resistors R5–R1 to the common point between resistors R6–R7, R7–R8, R8–R9, R9–R10, and R10–R11, respectively.

The D/A converter output signal appearing at the common point of resistors R10 and R11 is coupled through a conductor 45 to the positive input of an unity gain, voltage follower operational amplifier A1. A feedback resistor R12 couples the output of amplifier A1 to its negative input. The output signal from amplifier A1 is applied through resistor R13 to the negative input of an operational amplifier A4. The output of amplifier A4 is coupled through a resistor R26 to the base of transistor Q1 which is also coupled to ground by a resistor R27. The combination of amplifier A4 and transistor Q1 functions as a single, output feedback amplifier. A resistor R25 connected between the collector of transistor Q1 and the positive input of amplifier A4 provides amplifier feedback. A capacitor C6, shunting resistor R25, and a capacitor C3 shunting the negative input of amplifier A4 and its output, provide loop stabilization. The negative and positive inputs of amplifier A4 are coupled to ground through resistors R23 and R24, respectively.

The linear output voltage $V_{out}$ on the collector of transistor Q1 provides drive to a traction drive control circuit which includes a load resistor for transistor Q1 (not shown) through a low resistor R28. Amplifier A4 provides a high input impedance so as not to load down the input resistor network comprising resistors R13 and R23 in the linear encoder, and resistors R13, R17, R21, and R22 in the nonlinear encoder (described infra). The collector of transistor Q1 is connected to ground through capacitor C4, and in combination with a low value resistor 28 provides protection for transistor Q1 against transients that may be present on its collector.

The transients, for example, may be due to the switching of battery voltage energizing the traction drive motor.

The gain of amplifier A4, given by formula 1+R25/R24, should be made sufficiently large to compensate for signal attenuation in the D/A converter resistor ladder, and input resistor network of amplifier A4 comprising resistors R13 and R23 in the linear encoder and resistors R13, R17, R21, and R22 in the nonlinear encoder (described below).

In order to obtain a non-linear output voltage $V_{out}$, the open circuit at points X-X is replaced by a closed conductor and the closed conductor at points Y-Y is replaced by an open circuit. Performing these changes will result in operational amplifiers A2 and A3 of nonlinear gain circuit 46 being parallel-connected with amplifier A1.

An exemplary nonlinear output voltage $V_{out}$ is depicted graphically in FIG. 5 and constitutes a convex upward, piecewise linear function consisting of adjoining, variably sloped, linear segments I-J, J-K, and K-L. Segment I-J is the lowest gain portion of the curve and accordingly provides the smallest variation of voltage $V_{out}$ against change in throttle position. This allows greater control over vehicle acceleration, for example, at startup. Segments J-K and K-L represent increasingly higher slopes and gain and concomitantly greater change in $V_{out}$ for given change in throttle position. As in FIG. 4, the maximum voltage $V_{out}$ of 3.65 volts occurs when the accelerator is at its rest position and the minimum of 0.3 volts occurs at maximum accelerator displacement.

The positive input of amplifier A2 is connected to the output of D/A converter 44, while the output of amplifier A2 is coupled through series-coupled resistors R16 and R17 and electrically-linked points X-X to the negative input of amplifier A4. A feedback resistor R15 couples the output of amplifier A2 to its negative input. The common point between resistors R16 and R17 is coupled to ground through a zener diode Z1. Resistor R14 couples the negative input of amplifier A2 to ground The positive input of amplifier A3 is coupled to the output of D/A converter 44. The output of amplifier A3 is applied through series-coupled resistors R20 and R21, and electrically-linked points X—X to the negative input of amplifier A4. A feedback resistor R19 couples the output of amplifier A3 to its negative input. The common point between resistors R20 and R21 is connected to ground by a zener diode Z2. The respective negative inputs of amplifiers A3 and A4 are coupled to ground through resistors R18 and R22, respectively.

In operation, when the accelerator is initially at its rest position, the amplitude of analog drive voltage from D/A converter 44, when amplified by amplifiers A2 and A3, is sufficiently high to bias zener diodes Z1 and Z2 into conduction, clamping each of the outputs of amplifiers A2 and A3 at a fixed voltage. Accordingly, the feed-forward path is through amplifier A1 only and portion I-J of voltage $V_{out}$, shown in FIG. 5, is generated. As the accelerator is progressively moved toward the maximum throttle position, the analog drive voltage from D/A converter 44 decreases until, at a point J, shown in FIG. 5, it is sufficiently small so that the output voltage of amplifier A2 is no longer high enough to maintain diode Z1 in a conductive state. The analog drive voltage is, however, large enough to maintain conduction through diode Z2. When diode Z1 is nonconductive, the output voltages of amplifier A1 and A2 are summed through resistors R13 and R17 across resistor R22 thereby resulting in greater over-all gain so that portion J-K of the nonlinear function shown in FIG. 5 is generated. As the analog drive signal further decreases, zener diode Z2 is biased into nonconduction, paralleling the outputs of amplifiers A1-A3 which are are summed essentially through resistors R13, R17, and R21 across resistor R22 and generate the greatest gain segment K-L shown in FIG. 5. (Resistors R16 and R20 are small compared to resistors R17 and R21, respectively, and may be neglected).

While an exemplary curve has been described and illustrated in FIG. 5, any desired upward convex curve may be generated by judicious selection of zener diodes Z1 and Z2, the gains of amplifier A2 (given by 1+R15/R14) and amplifier A3 (given by 1+R19/R18) and resistors R13, R17, and R21. Concave upward curves may be generated by connecting the anodes of zener diodes Z1 and Z2 to a positive voltage source, and judiciously selecting the gains of amplifiers A2 and A3, zener diodes Z1 and Z2, as well as resistors R13, R17 and R21. For example, the piece-wise linear curve illustrated by dashed lines in FIG. 5 may be suitable for an on-road electric vehicle. It provides higher gain in the initial segment so that the highest acceleration is available at the initial portion of accelerator range. Lower acceleration rates are provided by the remaining two segments.

FIG. 4 illustrates a "full-on" decode circuit which may be employed in the circuit of FIG. 3. Outputs A-E from Gray code to binary converter 43 (shown in FIG. 3) drive the corresponding inputs A-E of a NAND gate 41. In response to the detection of a predetermined binary output, for example all 1's, indicating greater than 90 percent throttle displacement (shown in FIGS. 5 and 6), NAND gate 41 provides a signal through an inverter 40 and a series-coupled resistor R29 to the base of a transistor Q2. An output voltage indicating the detection of the predetermined binary code appears on the collector of transistor Q2 and through a low value resistor R30 on a terminal 42. Low value resistor R30, in conjunction with a capacitor C5 coupling the collector of transistor Q2 to ground, provides protection for transistor Q2 against transients that may otherwise be present on the collector. Traction drive control circuit to which transistor Q2 is coupled includes load resistor for transistor Q2 (not shown).

Although the encoder of the present invention may be entirely assembled from discrete components, in the preferred embodiment the encoder is fabricated in the form of a conventional hybrid device which comprises the electrical components of D/A converter 44, function generator circuit 47 (shown in FIG. 3), and the "full-on" detect circuit (shown in FIG. 6). Typically, in such hybrid devices, resistive elements and conductors are thick film printed on an insulating alumina substrate. Resistors are intentionally printed with low values, which are subsequently adjustable upward by a process employing a laser and known as "active trimming". Components such as capacitors and transistors, available commercially in a form known as "chip capacitors" or "chip transistors", for example, and discrete devices such as diodes are soldered to conductive contact points on the alumina substrate.

In the preferred embodiment of the linear and nonlinear encoders shown in FIG. 3, the resistance of summing resistors R23 and R22, respectively, is actively trimmed during tests performed in the course of fabricating the encoder hybrid. In this manner, the encoder generates the linear or nonlinear voltage functions having the desired respective slopes without requiring any additional electrical adjustments. In the embodiments employing an encoder hybrid, the only post-fabrication adjustment necessary is to optically align mask slots 3 with diodes D1–D5 and phototransistors Q3–Q7.

From the foregoing, it may be appreciated that the present invention provides a versatile, low-cost, long-life optoelectronic absolute position encoded accelerator control which is reliable, operable over a wide range of operating conditions, and which requires only minimal post-fabrication adjustment.

While this invention has been described with reference to particular embodiments and examples, other modifications and variations will occur to those skilled in the art in view of the above teachings. Accordingly, it should be understood that the appended claims are intended to cover all such modifications and variations that fall within the true spirit of the invention.

The invention claimed is:

1. An optoelectronic position encoder for providing a signal indicative of the absolute position of an encoder slide, comprising:
   an optical interrupter assembly, including a plurality of paths of optical wavelength radiation passing therethrough, and a plurality of photodetectors each photodetector being in optical communication with a separate one of said paths of optical wavelength radiation, respectively; and
   an encoder slide positioned for linear movement through said interrupter, said slide having optically transmissive windows arranged in a Gray code pattern, said windows being disposed in tandem and colinear with the line of movement of said slide so that in response to said movement said photodetectors detect said radiation transmitted through said windows and produce a Gray coded electronic signal indicative of the absolute position of said slide.

2. The optoelectronic position encoder of claim 1 further comprising:
   a mask having a plurality of slots, said mask being positioned parallel to said slide adjacent to said photodetectors said slots being in optical alignment with said photodetectors and said paths of optical wavelength radiation.

3. The optoelectronic position encoder of claim 1 wherein said optical radiation source comprises at least one light-emitting diode and wherein said photodetectors comprise a plurality of phototransistors.

4. The optoelectronic position encoder of claim 1 further comprising:
   circuit means for providing a variable amplitude voltage in response to said Gray coded signal, wherein the amplitude of said voltage varies in a step-wise manner over the range of travel of said slide and wherein said voltage amplitude indicates the absolute position of said slide.

5. The optoelectronic position encoder of claim 4 wherein said circuit means for providing a variable amplitude voltage comprises:
   means for converting said Gray coded electronic signal to a binary coded signal;
   a D/A converter for converting said binary coded electronic signal to an analog signal; and,
   function generator means for generating said variable amplitude voltage with a selected slope in response to said analog signal.

6. The optoelectronic encoder of claim 5, wherein said function generator means for generating said variable amplitude voltage includes means for adjusting the slope of said variable amplitude voltage as a linear function of the position of said slide.

7. A linear optoelectronic absolute position encoded accelerator control for an electric vehicle comprising:
   the optoelectronic position encoder of claim 5 further including an accelerator control and mechanical linkage means coupling said accelerator control to said slide, whereby linear motion of said accelerator causes linear slide motion across said interrupter assembly.

8. The optoelectronic encoder of claim 5, wherein said function generator means includes means for generating said variable amplitude voltage as a multi-segment, piece-wise linear function of the position of said slide, and wherein the slope of each segment of said piecewise linear function is different from the slope of any adjoining segment.

9. The optoelectronic encoder of claim 8 wherein said function generator means comprises:
   a plurality of parallel coupled amplifier circuits for amplifying said analog signal from said D/A converter, said amplifier circuits including means coupled to the output of said amplifier circuits, respectively, for clamping the output of certain ones of said amplifiers so that the sum of the outputs of the remaining amplifiers generates a segment of said multi-segment, piece-wise linear function.

10. The optoelectronic encoder of claim 9 wherein said means for clamping the output of certain ones of said amplifiers comprises a zener diode.

11. A nonlinear, optoelectronic absolute position encoded accelerator control for an electric vehicle comprising:
   the optoelectronic encoder of claim 9, further including an accelerator control and mechanical linkage means coupling said accelerator control to said slide, whereby linear motion of said accelerator causes linear slide motion through said interrupter assembly.

12. The optoelectronic control of claim 7 or claim 11 further comprising:
   means coupled to said Gray code to binary converter for detecting a predetermined binary coded signal from said means for converting said Gray coded signal to a binary signal and for providing a signal in response thereto.

* * * * *